(12) United States Patent
Wirz et al.

(10) Patent No.: US 12,087,720 B2
(45) Date of Patent: Sep. 10, 2024

(54) SEMICONDUCTOR DEVICE ASSEMBLY WITH SURFACE-MOUNT DIE SUPPORT STRUCTURES

(71) Applicant: Micron Technology, Inc., Boise, ID (US)

(72) Inventors: Brandon P. Wirz, Boise, ID (US); Benjamin L. McClain, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 666 days.

(21) Appl. No.: 17/198,144

(22) Filed: Mar. 10, 2021

(65) Prior Publication Data

US 2021/0193606 A1 Jun. 24, 2021

Related U.S. Application Data

(63) Continuation of application No. 15/603,327, filed on May 23, 2017, now Pat. No. 10,950,568.

(51) Int. Cl.
*H01L 23/00* (2006.01)
*H01L 25/00* (2006.01)
(Continued)

(52) U.S. Cl.
CPC .............. *H01L 24/14* (2013.01); *H01L 24/02* (2013.01); *H01L 24/04* (2013.01); *H01L 24/06* (2013.01);
(Continued)

(58) Field of Classification Search
CPC . H01L 2224/14515; H01L 2224/14517; H01L 2224/14519; H01L 2224/17515;
(Continued)

(56) References Cited

U.S. PATENT DOCUMENTS 9,607,973 B1 * 3/2017 Fasano ................... H01L 24/16
10,923,447 B2 2/2021 Wirz et al.
(Continued)

FOREIGN PATENT DOCUMENTS

| CN | 101681886 A | 3/2010 |
|---|---|---|
| CN | 104241215 A | 12/2014 |
| DE | 10227342 A1 | 1/2004 |
| WO | 2005122706 A2 | 12/2005 |

OTHER PUBLICATIONS

CN Patent Application No. 201880033499.2—Chinese Office Action and Search Report, dated Sep. 27, 2022, with English Translation, 20 pages.
(Continued)

*Primary Examiner* — Kevin Parendo
(74) *Attorney, Agent, or Firm* — Perkins Coie LLP

(57) ABSTRACT

A semiconductor device assembly is provided. The assembly includes a first package element and a second package element disposed over the first package element. The assembly further includes a plurality of die support structures between the first and second package elements, wherein each of the plurality of die support structures has a first height, a lower portion surface-mounted to the first package element and an upper portion in contact with the second package element. The assembly further includes a plurality of interconnects between the first and second package elements, wherein each of the plurality of interconnects includes a conductive pillar having a second height, a conductive pad, and a bond material with a solder joint thickness between the conductive pillar and the conductive pad. The first height is about equal to a sum of the solder joint thickness and the second height.

20 Claims, 7 Drawing Sheets

(51) Int. Cl.
  *H01L 25/065* (2023.01)
  *H01L 25/16* (2023.01)
  *H01L 25/18* (2023.01)
(52) U.S. Cl.
  CPC .............. *H01L 24/13* (2013.01); *H01L 24/16* (2013.01); *H01L 24/17* (2013.01); *H01L 25/0657* (2013.01); *H01L 25/50* (2013.01); H01L 25/16 (2013.01); H01L 25/18 (2013.01); H01L 2224/02372 (2013.01); H01L 2224/0401 (2013.01); H01L 2224/05022 (2013.01); H01L 2224/05073 (2013.01); H01L 2224/05147 (2013.01); H01L 2224/05561 (2013.01); H01L 2224/05564 (2013.01); H01L 2224/05568 (2013.01); H01L 2224/05573 (2013.01); H01L 2224/05644 (2013.01); H01L 2224/05655 (2013.01); H01L 2224/0603 (2013.01); H01L 2224/06517 (2013.01); H01L 2224/13007 (2013.01); H01L 2224/13016 (2013.01); H01L 2224/13023 (2013.01); H01L 2224/13082 (2013.01); H01L 2224/1403 (2013.01); H01L 2224/14051 (2013.01); H01L 2224/14517 (2013.01); H01L 2224/16013 (2013.01); H01L 2224/16059 (2013.01); H01L 2224/16148 (2013.01); H01L 2224/16238 (2013.01); H01L 2224/17051 (2013.01); H01L 2224/17517 (2013.01); H01L 2224/94 (2013.01); H01L 2224/97 (2013.01); H01L 2225/06513 (2013.01); H01L 2225/06541 (2013.01); H01L 2225/06565 (2013.01); H01L 2225/06593 (2013.01); H01L 2924/1431 (2013.01); H01L 2924/1434 (2013.01); H01L 2924/19041 (2013.01); H01L 2924/19042 (2013.01); H01L 2924/19043 (2013.01); H01L 2924/19103 (2013.01); H01L 2924/19104 (2013.01); H01L 2924/3511 (2013.01)

(58) Field of Classification Search
  CPC . H01L 2224/17519; H01L 2224/14505; H01L 2224/17505; H01L 2224/0603; H01L 2224/0903; H01L 2224/1403; H01L 2224/1703; H01L 2224/0212–0226; H01L 2224/1012–10175
  See application file for complete search history.

(56) References Cited

U.S. PATENT DOCUMENTS

| | | |
|---|---|---|
| 2003/0102555 A1* | 6/2003 | Patel .................. H01L 24/81 |
| | | 257/E23.079 |
| 2004/0036181 A1 | 2/2004 | Hiedler et al. |
| 2004/0232533 A1 | 11/2004 | Hatakeyama |
| 2004/0238208 A1 | 12/2004 | Andrews et al. |
| 2005/0173796 A1* | 8/2005 | Pflughaupt ............ H01L 23/50 |
| | | 257/E23.079 |
| 2007/0007665 A1 | 1/2007 | Clevenger et al. |
| 2008/0088001 A1 | 4/2008 | Kim et al. |
| 2010/0013032 A1 | 1/2010 | Oppermann et al. |
| 2011/0001250 A1 | 1/2011 | Lin et al. |
| 2011/0101523 A1 | 5/2011 | Hwang et al. |
| 2011/0186978 A1* | 8/2011 | Kim .................... H01L 29/92 |
| | | 257/777 |
| 2012/0001329 A1 | 1/2012 | Kim et al. |
| 2012/0012985 A1 | 1/2012 | Shen et al. |
| 2012/0267779 A1 | 10/2012 | Lin et al. |
| 2013/0277801 A1* | 10/2013 | Chen .................. H01L 23/642 |
| | | 257/532 |
| 2014/0061897 A1 | 3/2014 | Lin et al. |
| 2014/0167254 A1 | 6/2014 | Yu et al. |
| 2014/0353838 A1 | 12/2014 | Lin et al. |
| 2015/0001704 A1 | 1/2015 | Lu et al. |
| 2015/0171038 A1 | 6/2015 | Lin et al. |
| 2015/0228587 A1 | 8/2015 | Cheng et al. |
| 2015/0340343 A1 | 11/2015 | Chen |
| 2016/0079208 A1 | 3/2016 | Heo et al. |
| 2016/0190080 A1* | 6/2016 | Chen .................... H01L 24/11 |
| | | 257/773 |
| 2017/0170134 A1* | 6/2017 | Audet ................... H01L 24/73 |
| 2018/0005988 A1* | 1/2018 | Deligianni ............ H01L 27/092 |
| 2018/0012838 A1* | 1/2018 | Arvin .................... H01L 24/48 |
| 2018/0342476 A1 | 11/2018 | Wirz et al. |
| 2021/0167030 A1 | 6/2021 | Wirz et al. |

OTHER PUBLICATIONS

International Application No. PCT/US2018/029415—International Search Report and Written Opinion, mailed Aug. 10, 2018, 14 pages.
Office Action and Search Report dated Nov. 12, 2019 for Taiwan Patent Application No. 107115847, 7 pages (with translation).
Office Action mailed May 14, 2019 for Taiwan Patent Application No. 107115847, 9 pages (with translation).

* cited by examiner

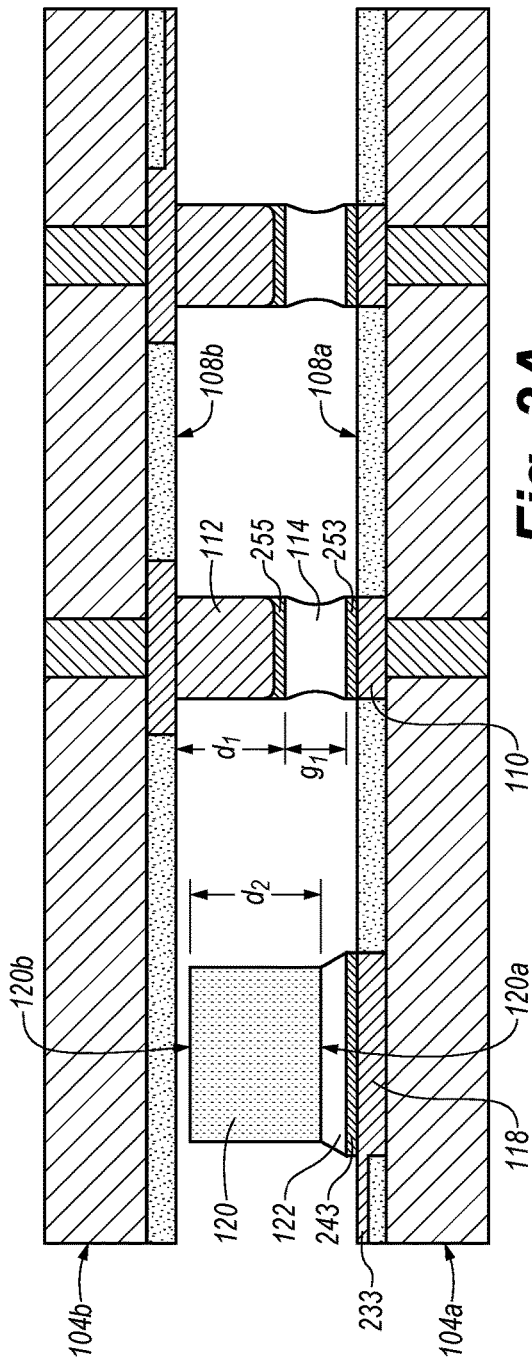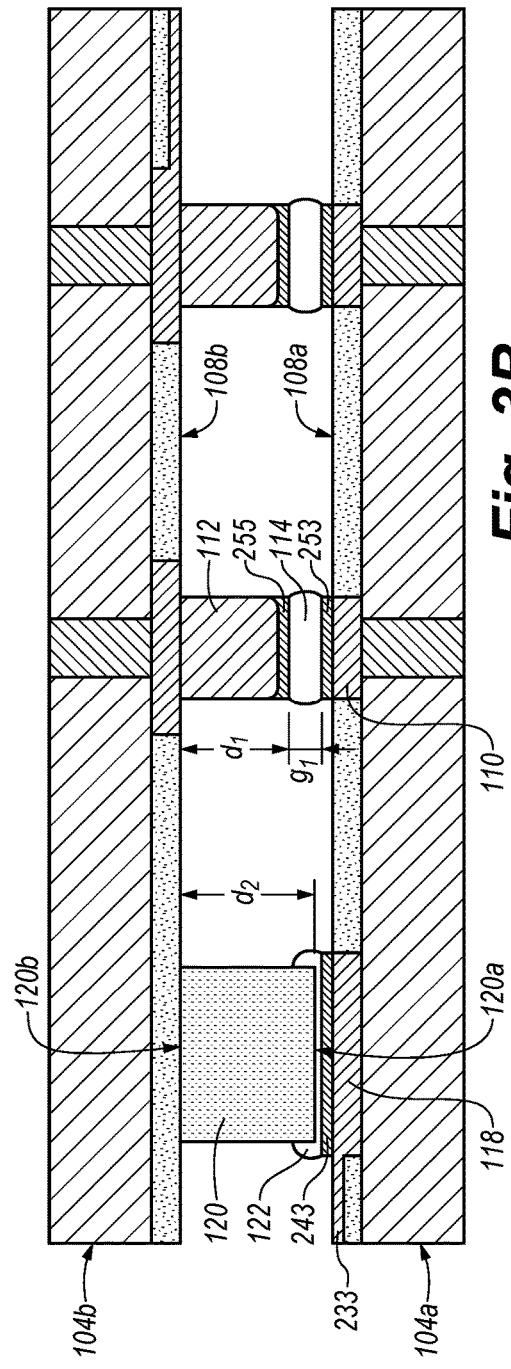

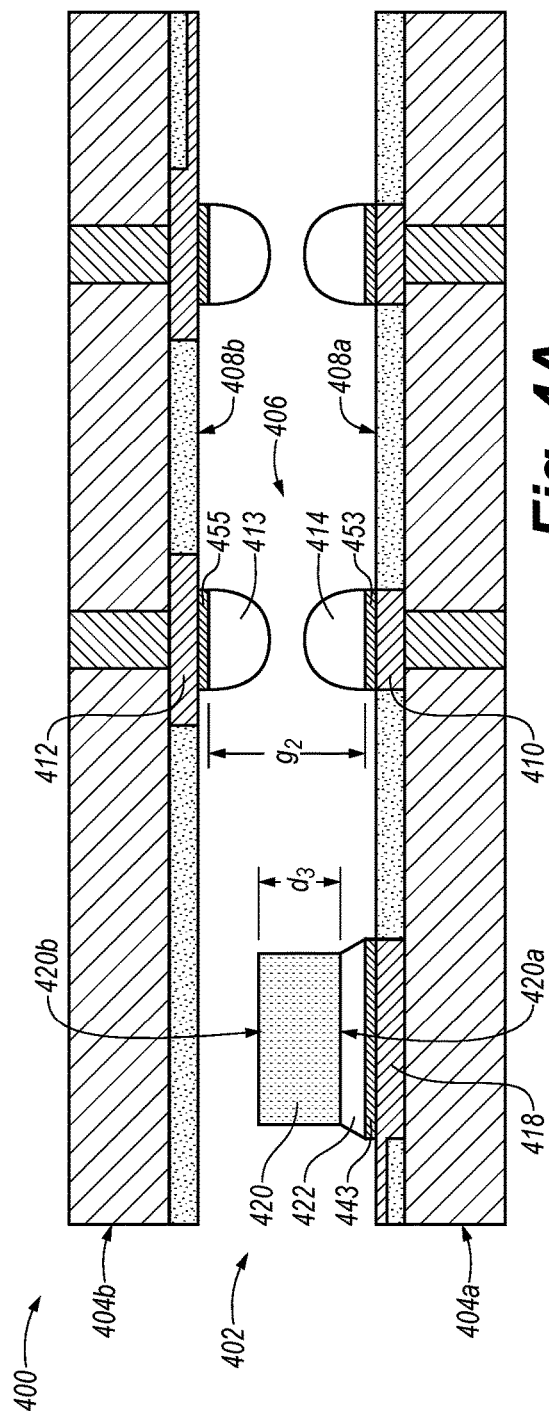
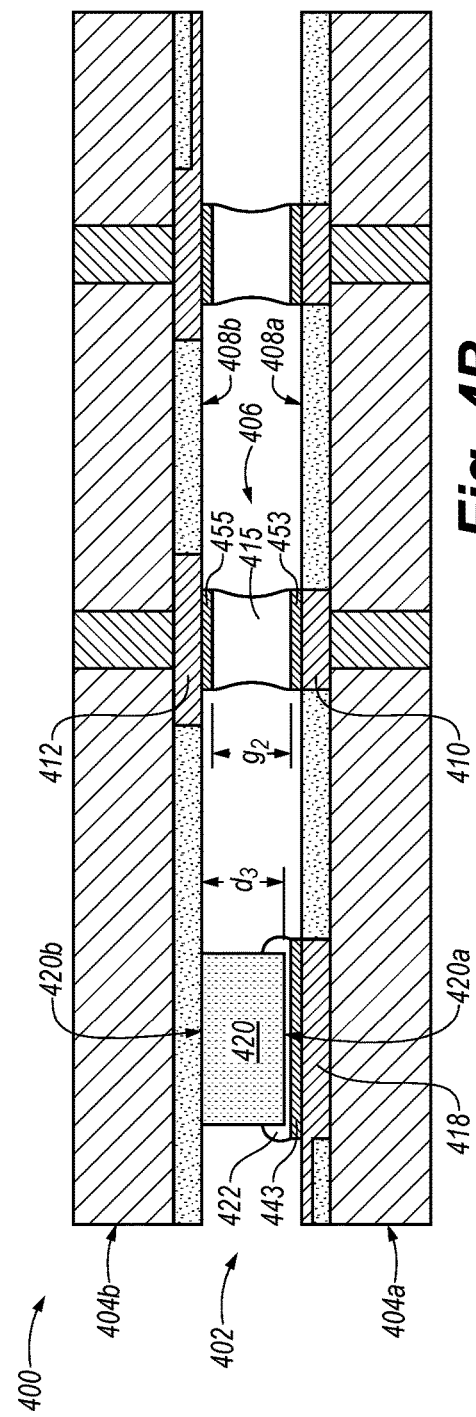
Fig. 4A
Fig. 4B

SEMICONDUCTOR DEVICE ASSEMBLY WITH SURFACE-MOUNT DIE SUPPORT STRUCTURES

CROSS-REFERENCE TO RELATED APPLICATION(S)

This application is a continuation of U.S. patent application Ser. No. 15/603,327, filed May 23, 2017, which is incorporated herein by reference in its entirety.

This application contains subject matter related to U.S. patent application Ser. No. 15/603,175, filed May 23, 2017, now U.S. Pat. No. 10,923,447, by Brandon Wirz, entitled "SEMICONDUCTOR DEVICE ASSEMBLY WITH DIE SUPPORT STRUCTURES." The related application, of which the disclosure is incorporated by reference herein, is assigned to Micron Technology, Inc.

TECHNICAL FIELD

The disclosed embodiments relate to semiconductor device assemblies having surface-mount die support structures. In several embodiments, the present technology relates to surface-mount die support structures configured to mechanically support interconnects positioned between stacked package elements.

BACKGROUND

Packaged semiconductor dies, including memory chips, microprocessor chips, and imager chips, typically include a semiconductor die mounted on a substrate and encased in a plastic protective covering or metal heat spreader. The die includes functional features, such as memory cells, processor circuits, and imager devices, as well as bond pads electrically connected to the functional features. The bond pads can be electrically connected to terminals outside the protective covering to allow the die to be connected to higher level circuitry. Within some packages, semiconductor dies can be stacked upon and electrically connected to one another by individual interconnects placed between adjacent dies. In such packages, each interconnect can include a conductive material (e.g., solder) and a pair of contacts on opposing surfaces of adjacent dies. For example, a metal solder can be placed between the contacts and reflowed to form a conductive joint.

One challenge with traditional solder joints is that they can be susceptible to breakage during assembly of the dies. For example, the solder joints can be damaged if excessive force is applied during bonding of adjacent dies. This can lead to open-circuit or high electrical impedance across the joint, or alternatively can cause the joint to increase in diameter until it mechanically contacts one or more adjacent solder joints, creating an electrical short circuit. Accordingly, there is a need for more mechanically robust semiconductor device assemblies.

BRIEF DESCRIPTION OF THE DRAWINGS

FIGS. 3A and 3B are cross-sectional views illustrating a semiconductor device assembly at various stages in a method of manufacture in accordance with selected embodiments of the present technology.

FIGS. 4A and 4B are cross-sectional views illustrating a semiconductor device assembly at various stages in a method of manufacture in accordance with selected embodiments of the present technology.

DETAILED DESCRIPTION

Figure 1:
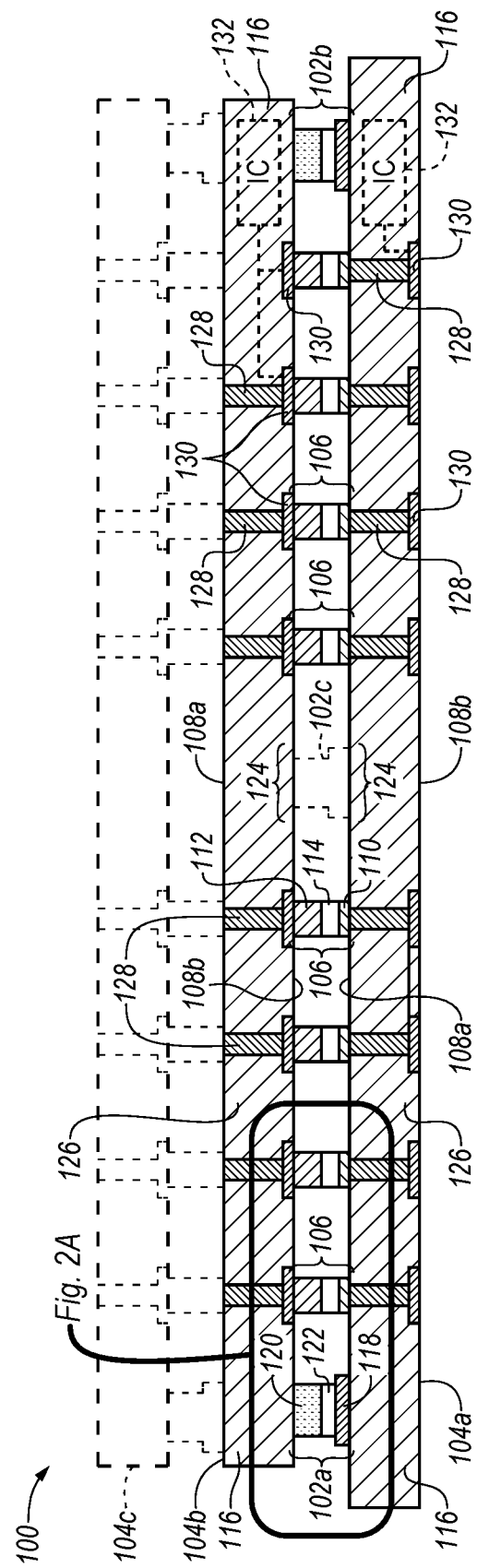
FIG. 1 is a cross-sectional view of a semiconductor device assembly having interconnects and die support structures in accordance with an embodiment of the present technology.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor devices are continually designed with ever greater needs for increased mechanical robustness. Accordingly, several embodiments of semiconductor device assemblies in accordance with the present technology can include die support structures, which can provide increased mechanical robustness to stacked semiconductor dies of the assembly.

Several embodiments of the present technology are directed to semiconductor device assemblies, semiconductor packages, systems including semiconductor devices, and methods of making and operating semiconductor devices. In one embodiment, a semiconductor device assembly includes a first package element and a second package element disposed over the first package element. The assembly further includes a plurality of die support structures between the first and second package elements, wherein each of the plurality of die support structures has a first height, a lower portion surface-mounted to the first package element and an upper portion in contact with the second package element. The assembly further includes a plurality of interconnects between the first and second package elements, wherein each of the plurality of interconnects includes a conductive pillar having a second height, a conductive pad, and a bond material with a solder joint thickness between the conductive pillar and the conductive pad. The first height can be about equal to a sum of the solder joint thickness and the second height. The interconnects can optionally omit the conductive pillar, such that the first height can be about equal to the solder joint thickness.

Embodiments of semiconductor device assemblies having surface-mount die support structures are described below. In various embodiments, the surface-mount die support structures can be configured to mechanically support interconnects positioned between stacked dies in a semiconductor device assembly, or between a die and a substrate or interposer over which the die is stacked. The die support structures can also optionally be configured to provide electrical interconnection between adjacent package elements (e.g., between adjacent dies or between a die and an adjacent substrate or interposer), or thermal pathways for conducting heat through the stacked dies. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. The term "semiconductor device" generally refers to a solid-state device that includes semiconductor material. A semiconductor device can include, for example, a semiconductor substrate, wafer, panel, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing.

As used herein, the terms "vertical," "lateral," "upper," and "lower" can refer to relative directions or positions of features in the semiconductor device assembly view of the orientation shown in the Figures. For example, "upper" or "uppermost" can refer to a feature positioned closer to the top of a page than another feature. These terms, however, should be construed broadly to include semiconductor devices and semiconductor device assemblies having other orientations, such as inverted or inclined orientations where top/bottom, over/under, above/below, up/down, and left/right can be interchanged depending on the orientation.

FIG. 1 is a cross-sectional view of a semiconductor device assembly 100 ("assembly 100") having first and second die support structures 102a and 102b (collectively "die support structures 102") configured in accordance with an embodiment of the present technology. The assembly 100 includes a first package element 104a (e.g., a substrate, an interposer, or a semiconductor die), a second package element 104b (e.g., a substrate, an interposer, or a semiconductor die) (collectively "package elements 104"), and an array of individual interconnects 106 extending vertically between first and second sides 108a and 108b of the package elements 104a and 104b, respectively. The interconnects 106 can each include, for example, a first conductive feature (e.g., a conductive pad 110) on the first side 108a of the first package element 104a, a second conductive feature (e.g., a conductive pillar 112) on the second side 108b of the second package element 104b, and a bond material 114 bonding the conductive pillar 112 to the conductive pad 110.

The die support structures 102 are located in peripheral regions 116 of the package element 104 on opposite sides of the array of interconnects 106. The die support structures 102 can each include a structural element 120 with lower portion surface-mounted to the first side 108a of the first package element 104a and an upper portion in contact with the second side 108b of the second package element 104b. The structural element 120 can be a discrete circuit element (e.g., a capacitor, resistor, inductor, transistor or the like) surface-mounted to one or more mounting pads 118 on the first package element 104a to provide electrical connectivity to other circuit elements in the first package element 104a. In another embodiment, the structural element 120 can be a bulk material or dummy structure that is electrically isolated from other circuit elements of the package element 104. In various embodiments described in greater detail below, the die support structures 102 are configured to mechanically support the package elements 104 and prevent or at least inhibit warpage of the package elements 104, such as during device manufacture.

In practice, the assembly 100 can include a greater number of interconnects 106 and/or die support structures 102 than shown in the illustrated embodiments. For example, the assembly 100 can include tens, hundreds, thousands, or more interconnects 106 arrayed between the package elements 104. Additionally, in various embodiments die support structures 102 can be positioned interstitially between individual and/or groups of interconnects 106 (e.g., between a group of 5, 20, 100, or more interconnects within an array). For example, in some embodiments a die support structure 102c (shown in hidden lines) can be positioned between medial regions 124 near the center of the package element 104. In other embodiments, die support structures 102 can be positioned at a variety of other positions between the package elements 104.

As further shown in FIG. 1, each of the package elements 104 includes a semiconductor substrate 126 (e.g., a silicon substrate, a gallium arsenide substrate, an organic laminate substrate, etc.) and conductive elements (e.g., through-silicon vias, through-mold vias, or other conductive members connecting front and back sides of a package substrate or interposer) 128 extending through the substrate 126 from the first side 108a to the second side 108b of the package element 104. The conductive elements 128 are coupled to corresponding interconnects 106. In some embodiments, the conductive elements 128 can be coupled to substrate pads 130 or other conductive features located on either side of the semiconductor substrate 126.

Each substrate 126 can include integrated circuitry 132 (shown schematically) coupled to one or more of the substrate pads 130 and/or the conductive elements 128. The integrated circuitry 132 can include, for example, a memory circuit (e.g., a dynamic random memory (DRAM)), a controller circuit (e.g., a DRAM controller), a logic circuit, and/or other circuits. In some embodiments, the assembly 100 can include other structures and features, such as an underfill material (not shown) deposited or otherwise formed around and/or between the package elements 104. In the embodiment illustrated in FIG. 1, the assembly 100 includes two package elements 104. In practice, however, the assembly 100 can include a different number of package elements, such as two dies over a substrate, three dies over an interposer, four dies, eight dies, sixteen dies, or more. For example, in another embodiment, the assembly 100 can include a third package element 104c (e.g., a semiconductor die shown in hidden lines) on the second package element 104b. In some embodiments, the assembly 100 can include a casing (not shown), such as a thermally conductive casing, that encloses the package elements 104 within an enclosure. In these and other embodiments, the assembly 100 can include a support substrate (e.g., package element 104a), such as an interposer and/or a printed circuit board, configured to operably couple the other package elements 104b and 104c to external circuitry (not shown). The semiconductor dies can be similarly spaced from such a support substrate or interposer and supported by die support structures 102 surface-mounted on the support substrate or interposer in a manner similar to that illustrated in FIG. 1.

Figure 2A:
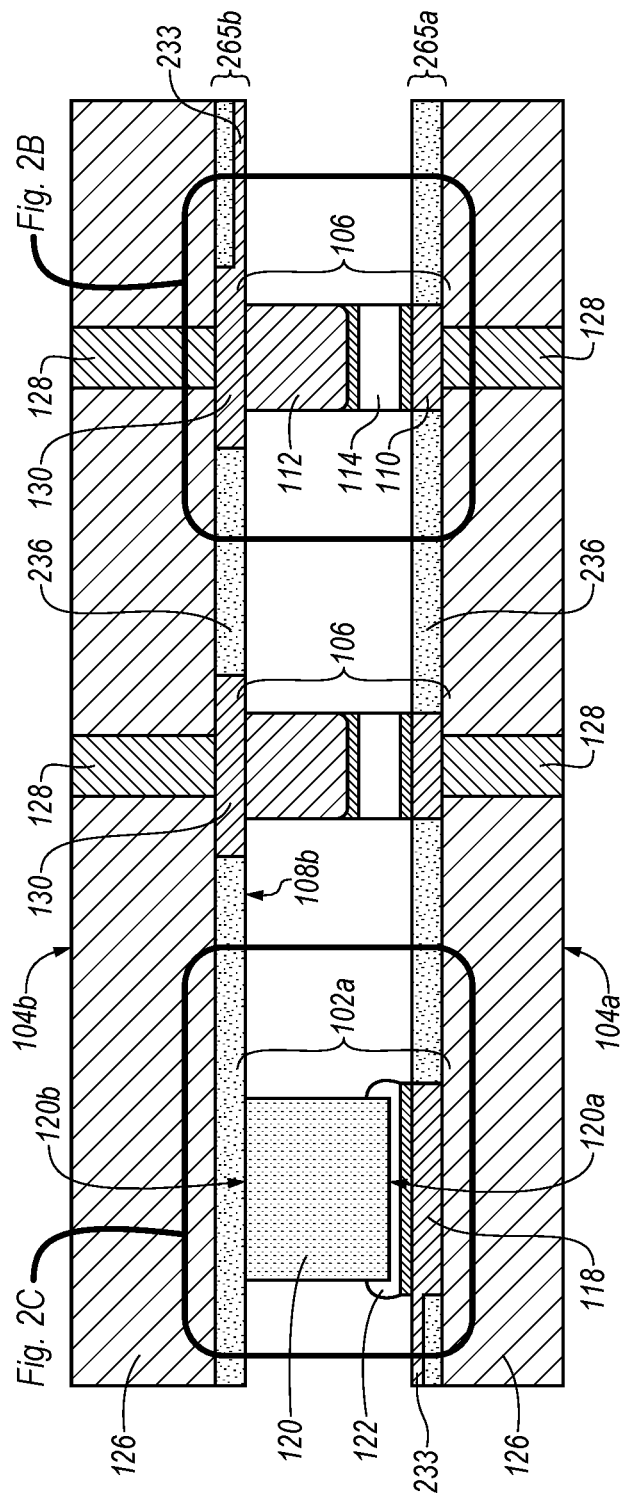
FIGS. 2A-2C are enlarged cross-sectional views of a semiconductor device assembly showing interconnects and a surface-mount die support structure configured in accordance with an embodiment of the present technology.

FIG. 2A is an enlarged cross-sectional view showing several interconnects 106 and the die support structure 102a configured in accordance with an embodiment of the present technology. Referring to FIG. 2A, the die support structure 102a includes a structural element 120 with lower portion 120a surface-mounted to the first side 108a of the first package element 104a and an upper portion 120b in contact with the second side 108b of the second package element 104b. The structural element 120 can be surface-mounted to one or more mounting pads 118 on the first package element 104a using a bond material 122 (e.g., solder). The conductive pad 110 of the interconnect 106 can be coupled to or form a part of a first redistribution structure 265a formed on the first side 108a of the first package element 104a. The conductive pillar 112 can be coupled to or form a part of a second redistribution structure 265b formed on the second side of the second package element 104b. Each of the redistribution structures 265 can include various conductive features 233 and a passivation material 236 (e.g., an oxide material) configured to provide electrical isolation between the conductive features 233. The conductive features 233 can include, for example, individual metal traces and/or pads that are coupled to one or more of the interconnects 106, the substrate pads 130 (FIG. 1), the conductive elements 128, etc.

Figure 2B:
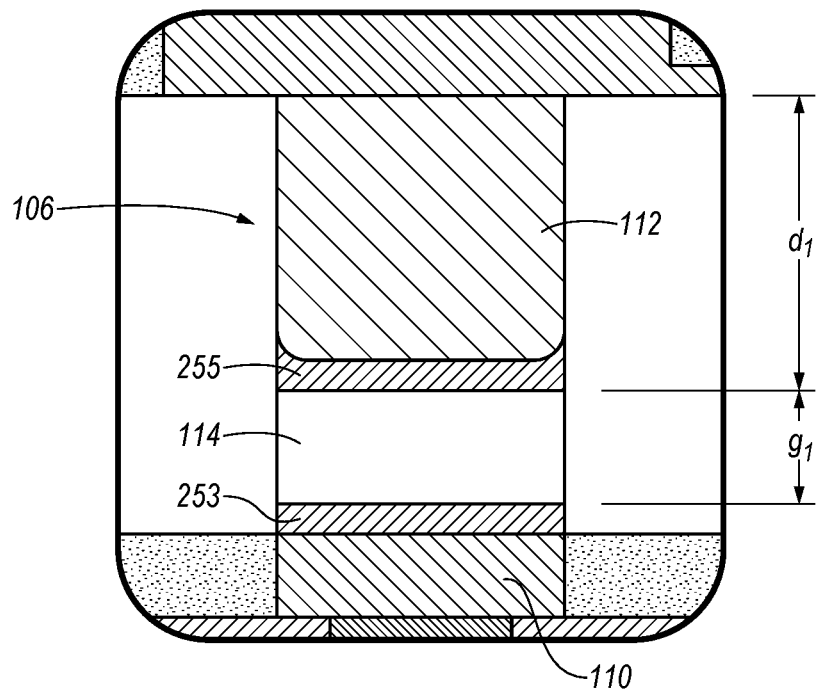

FIG. 2B is a further enlarged cross-sectional view showing one of the interconnects 106 in even more detail, in accordance with one aspect of the present technology. The conductive pillar 112 of the interconnect 106 includes an end portion attached to the conductive pad 110 by the bond material 114. The interconnect 106 can also include a first barrier material 255 (e.g., nickel, nickel-based intermetallic and/or gold) formed over the end portion of the conductive pillar 112, and second barrier material 253 (e.g., nickel, nickel-based intermetallic and/or gold) formed over the conductive pad 110. The barrier materials can facilitate bonding and/or prevent or at least inhibit the electromigration of copper or other metals used to form the conductive pillar 112 and the conductive pad 110. The bond material 114 bridges a gap $g_1$ (also known to those skilled in the art as a solder joint thickness) between the conductive pillar 112 and the conductive pad 110. The solder joint thickness $g_1$ is dictated at least in part by a first projection height $d_1$ of the conductive pillar 112 from the second side 108b of the second package element 104b.

Figure 2C:
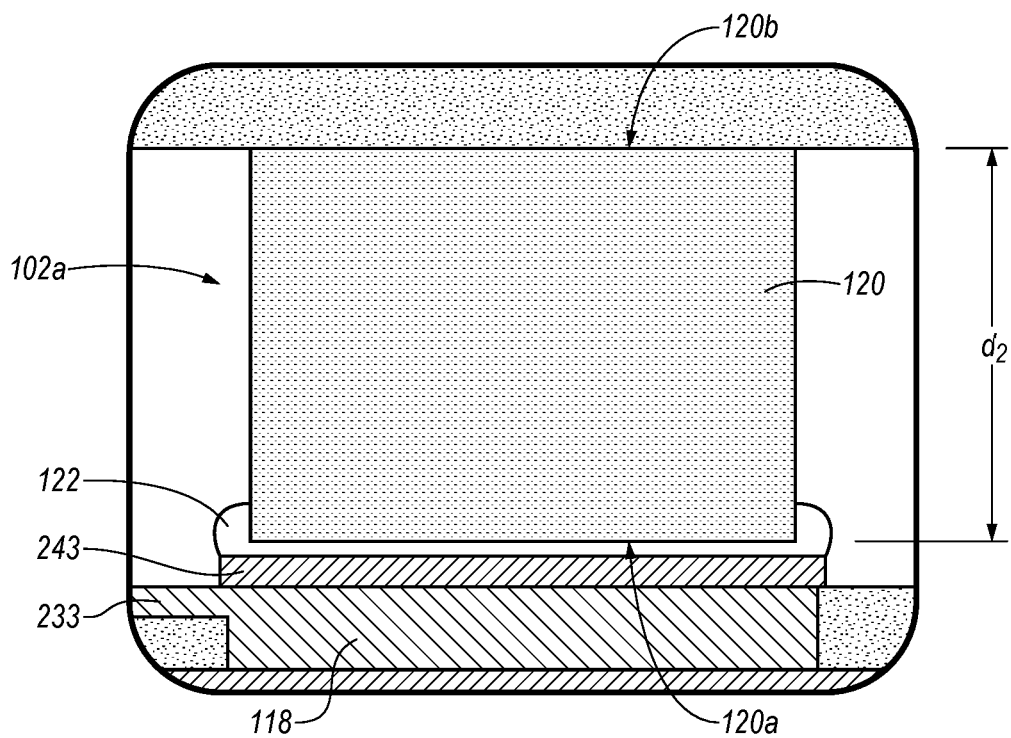

FIG. 2C is a further enlarged cross-sectional view showing the die support structure 102a of FIG. 2A in even more detail. The structural element 120 extends above the mounting pad 118 by a second height $d_2$, which approximately defines the spacing between the first and second package elements 104. In this regard, the second height $d_2$ is approximately equal to the sum of the solder joint thickness $g_1$ and the first height $d_1$ of the conductive pillar 112 of the individual interconnects 106.

In accordance with one aspect of the present technology, providing a device assembly 100 with die support structures 102 configured to mechanically support the package elements 104 simplifies and improves the yield of the manufacturing of the device assembly 100. In this regard, one challenge with forming interconnects between package elements is that package elements can have an intrinsic amount of warpage (e.g., die warpage), which can produce tensile and/or compressive forces on the interconnects between package elements. In the absence of a die support structure, these forces can damage the interconnects during assembly of the device, either pulling interconnects apart (e.g., the tensile force) and causing open circuits, or excessively compressing interconnects (e.g., the compressive force) and causing the bond materials from adjacent interconnects to meet and create short circuits. By providing die support structures 102 around peripheral regions 116 of a package element (e.g., and optionally in medial regions 124), a thermo-compressive bonding operation can be used to force package elements 104 into parallel planar alignment by compressing the package elements 104 together until the upper portion 120b of the structural element 120 of each die support structure 102 is in contact with the second side 108b of the second package element 104b. With the die support structures 102 ensuring the parallel planar alignment of the package elements 104, the solder joint thickness $g_1$ of the interconnects 106 can be accurately compressed to within a desired range (e.g., by selecting a first height $d_1$ of the conductive pillars 112 of the interconnects 106 to be less than the second height $d_2$ of the structural element 120 of the die support structure 102 by a desired amount of the solder joint thickness $g_1$). The compressive bonding operation can counteract any intrinsic warpage in the package elements 104 (e.g., die warpage) by forcing the package elements into parallel planar alignment, not only in an uppermost package element being added to a stack, but in every package element in the stack that might otherwise be subject to warpage during inadvertent reflow of its solder connections.

In accordance with another aspect of the present technology, the mechanical strength of the die support structures 102 can permit a thermo-compressive bonding operation to utilize force feedback as a control mechanism for the operation, rather than a z-dimension offset, which can further simplify and improve the quality of the bonding operation. For example, during a thermo-compressive bonding operation, a force can be applied to a stack of two or more package elements while the bond materials in the die support structures 102 and interconnects 106 are reflowed, such that the upper portions 120b of the structural elements 120 of the die support structures 102 come into contact with the second side 108b of the second package element 104b and a measured resistance to the force is determined to increase as a result. The measured increase in resistance to the applied compressive force can be used to determine that the solder joint thickness $g_1$ between the conductive pillars 112 and the conductive pads 110 has therefore been reduced to within a known range (e.g., due to the predetermined difference between the height $d_1$ of the conductive pillars 112 and the height $d_2$ of the structural elements 120 of the die support structures 102). As will be readily apparent to those skilled in the art, measuring the resistance to a compressive force in such a bonding operation is a much simpler engineering challenge than maintaining a z-dimension movement across the bonding profile.

For example, FIGS. 3A and 3B are cross-sectional views illustrating semiconductor device assembly 100 at various stages in a method of manufacture in accordance with selected embodiments of the present technology. In FIG. 3A, assembly 100 is illustrated at the beginning of a thermo-compressive bonding operation, in which heating has caused the bond material 114 in the interconnects 106 to reflow and electrically connect the first and second barrier materials 255 and 253 of the conductive pillar 112 and the conductive pad 110, respectively. Before exerting the compressive force, the upper portion 120b of the structural element 120 of the die support structure 102 does not contact with the second side 108b of the second package element 104b, and the gap $g_1$ bridged by the bond material 114 of the interconnect 106 (e.g., the solder joint thickness) is still greater than a desired final amount.

In FIG. 3B, assembly 100 is illustrated at the completion of the thermo-compressive bonding operation, in which the compressive force and applied heat have caused the upper portion 120b of the structural element 120 of the die support structure 102 to contact the second side 108b of the second package element 104b such that the gap $g_1$ bridged by the bond material 114 of the interconnect 106 (e.g., the solder joint thickness) is within a desired range. After cooling, the bond material 114 solidifies and secures the package elements 104a and 104b in a parallel planar alignment (e.g., overcoming any intrinsic warpage) into which the compressive operation has forced them.

Although in the embodiment illustrated in FIGS. 1 through 3B the interconnects 106 are illustrated as including a pillar projecting from one of the package elements 104 (e.g., such that the solder joint thickness $g_1$ can be characterized as about equal to the difference between the height $d_2$ of the structural element 120 of the die support structure and the height $d_1$ of the conductive pillar), in other embodiments an interconnect between package elements can have any one of a number of different structures, including a structure omitting the conductive pillar. For example, FIGS. 4A and 4B illustrate an embodiment in which the interconnects between a semiconductor die and a support substrate (e.g., or between two semiconductor dies) are formed from simple solder bumps on conductive pads (e.g., omitting the pillars of the foregoing embodiment). In such an arrangement, the solder joint thickness of the interconnects can be about equal to the height of a die support structure.

Turning to FIG. 4A, the semiconductor device assembly 400 is illustrated at the beginning of a thermo-compressive bonding operation, in which heat has caused the solder bumps 413 and 414 in the interconnects 406 to reflow and electrically connect the upper and lower conductive pads 412 and 410, respectively. Before exerting the compressive force, the upper portion 420b of the structural element 420 of the die support structure 402 does not contact the second side 408b of the upper semiconductor die 404b, and the gap $g_2$ bridged by the bond materials 413 and 414 of the interconnect 406 (e.g., the solder joint thickness) is still greater than a desired final amount.

In FIG. 4B, assembly 400 is illustrated at the completion of the thermo-compressive bonding operation, in which the compressive force has caused the upper portion 420b of the structural element 420 of the die support structure 402 to contact the second side 408b of the upper semiconductor die 404b such that the gap $g_2$ bridged by the combined bond material 415 of the interconnect 406 (e.g., the solder joint thickness) is within a desired range. After cooling, the bond material 415 solidifies and secures the upper semiconductor die 404b and the lower support substrate 404a (e.g., or interposer or semiconductor die) in a parallel planar alignment (e.g., overcoming any intrinsic warpage) into which the compressive operation has forced them. As can be seen with reference to FIG. 4B, the height $d_3$ of the structural element 420 of the die support structure 402 is about equal to the distance between the upper semiconductor die 404b and the lower support substrate 404a, which in this embodiment in which the dies are interconnected by solder bump bonding, is also about equal to the solder joint thickness $g_2$.

In accordance with one aspect of the present technology, the inclusion of die support structures on a wafer or panel allows wafer- or panel-level assembly of die stacks without experiencing the reduction in yield caused by die warpage defects in traditional wafer- or panel-level assembly operations. In this regard, the arrangement of die support structures on a wafer or panel can be selected to balance a need for warpage mitigation with an amount of real estate dedicated to the die support structures. In one embodiment, the loss of usable die area due to the inclusion of die support structures can be mitigated by utilizing electrically active die support structures to replace other circuit elements (e.g., by utilizing a surface-mount capacitor as a die support element, which would otherwise consume surface area elsewhere in a semiconductor package, such as on a support substrate next to the die stack) rather than using dummy (e.g., electrically isolated or not active) die support structures that provide no electrical function in the circuits of the dies. As will be readily understood by one skilled in the art, the use of a discrete circuit element as a die support structure will determine the number of mounting pads necessary to surface mount the die support structure (e.g., two mounting pads for a two-terminal element, three mounting pads for a three-terminal element, etc.).

In accordance with another aspect of the present technology, one benefit of using die support structures 102 which are larger than (e.g., have a greater width than) the interconnects 106 is the improved mechanical support that the die support structures 102 can provide against compressive forces (e.g., the die support structures 102 are more mechanically robust and can better endure compression during a thermo-compressive bonding operation).

Figure 5:
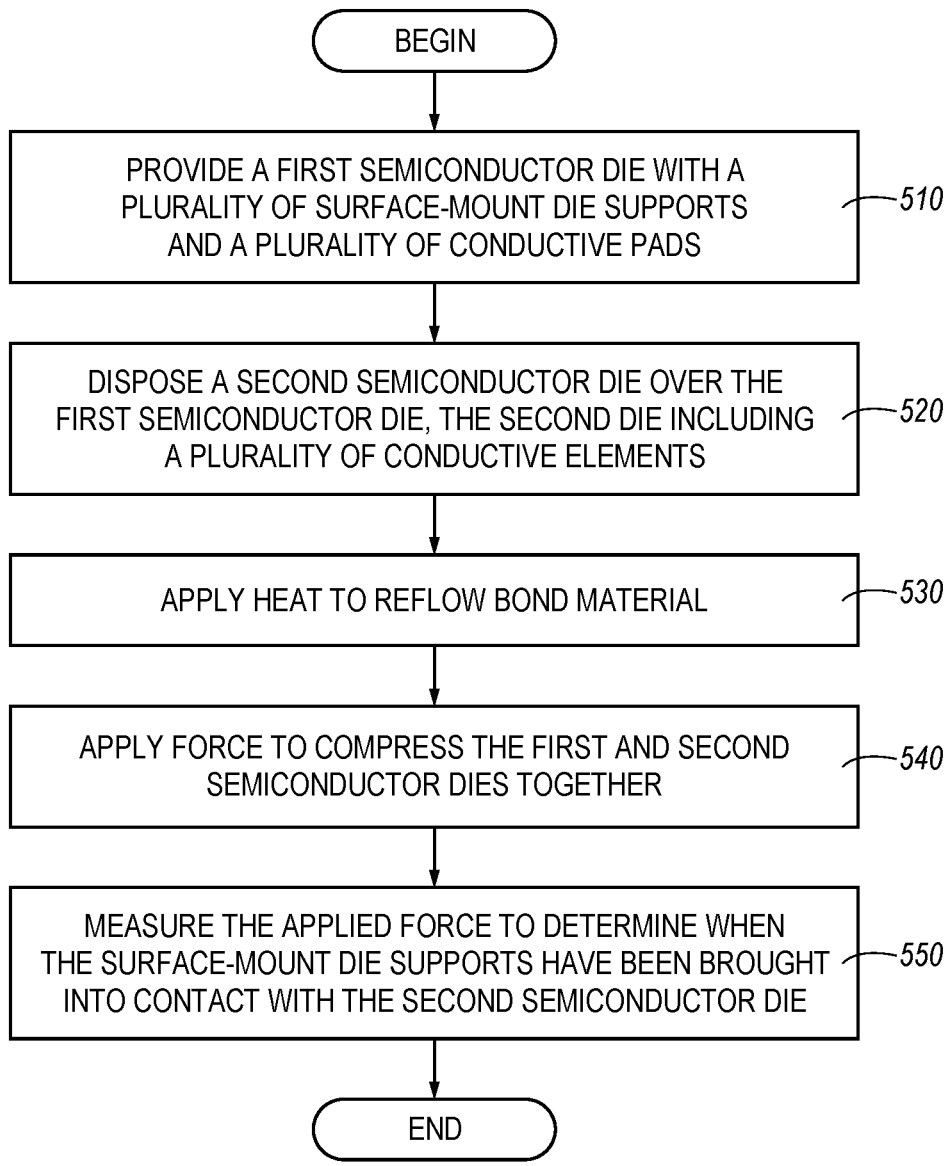
FIG. 5 is a flow chart illustrating a method of making a semiconductor device assembly in accordance with one embodiment of the present technology.

FIG. 5 is a flow chart illustrating a method for making a semiconductor device in accordance with one aspect of the present technology. The method includes providing a first package element (e.g., a support substrate, an interposer, or a semiconductor die) including a plurality of surface-mount die supports and a plurality of conductive pads (box 510) and disposing a second package element (e.g., a support substrate, an interposer, or a semiconductor die) over the first package element (box 520). The second package element includes a plurality of conductive elements, each being separated from a corresponding one of the plurality of conductive pads by a bond material. The method further includes reflowing the bond material (box 530) and applying force to compress the first package element and the package element die together such that each of the die support structures contacts the second package element (box 540). As the force is applied, the method further includes measuring the relative movement of the first and second package elements to determine when the die support structures have been brought into contact with the second package element (box 550).

Figure 6:
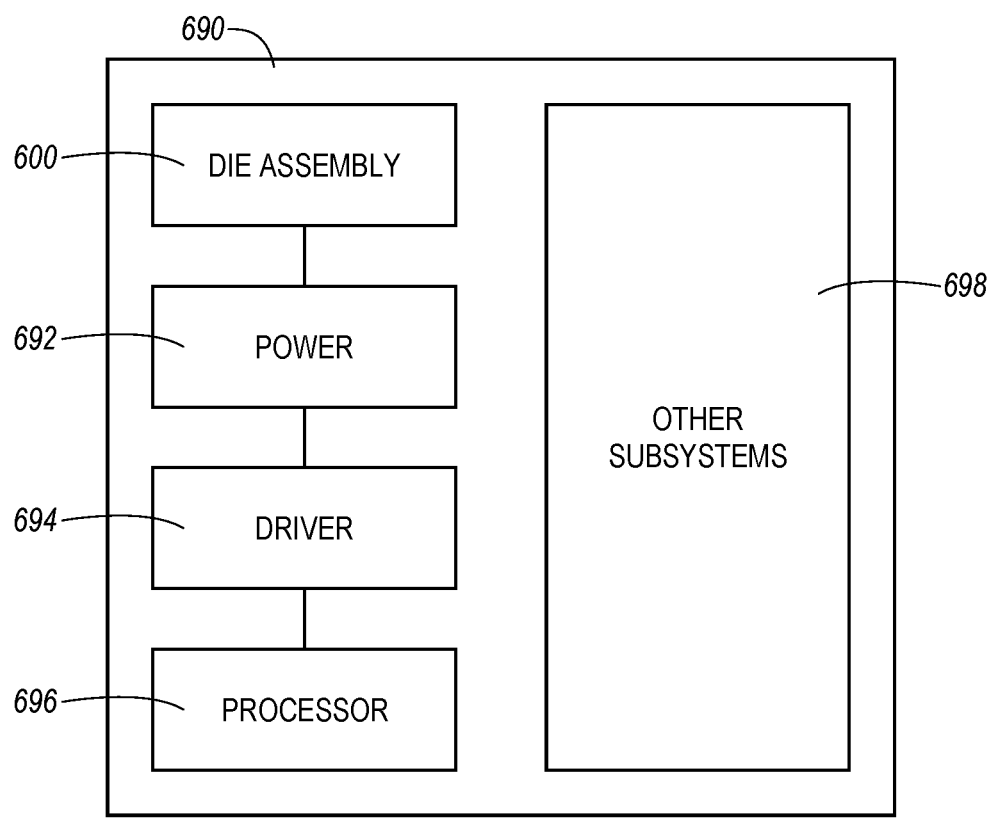
FIG. 6 is a schematic view of a system that includes a semiconductor device assembly configured in accordance with an embodiment of the present technology.

Any one of the die support structures and/or semiconductor device assemblies described above with reference to FIGS. 1 through 5 can be incorporated into any of a myriad of larger and/or more complex systems, a representative example of which is system 690 shown schematically in FIG. 6. The system 690 can include a semiconductor device assembly 600, a power source 692, a driver 694, a processor 696, and/or other subsystems or components 698. The semiconductor device assembly 600 can include features generally similar to those of the semiconductor device assemblies described above, and can therefore include die support structures for mechanically supporting interconnects positioned between stacked semiconductor dies of the assembly. The resulting system 690 can perform any of a wide variety of functions such as memory storage, data processing, and/or other suitable functions. Accordingly, representative systems 690 can include, without limitation, hand-held devices (e.g., mobile phones, tablets, digital readers, and digital audio players), computers, vehicle and other machines and appliances. Components of the system 690 may be housed in a single unit or distributed over multiple, interconnected units (e.g., through a communications network). The components of the system 690 can also include remote devices and any of a wide variety of computer readable media.

From the foregoing, it will be appreciated that specific embodiments of the technology have been described herein for purposes of illustration but that various modifications may be made without deviating from the disclosure. Moreover, although advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:
   a first package element including a first plurality of conductive features;
   a second package element disposed over the first package element, the second package element including a second plurality of conductive features and a passivation material configured to provide electrical isolation between the conductive features;
   a plurality of interconnects between the first and second package elements, wherein each of the plurality of interconnects includes a first conductive element on one of the first plurality of conductive features, a second conductive element on one of the plurality of conductive features, and a first bond material having a first thickness between the first and second conductive elements; and
   a plurality of die support structures between the first and second package elements, wherein each of the plurality of die support structures has an upper surface in direct contact with the passivation material of the second package element and is surface-mounted to at least one of the first plurality of conductive features of the first package element by a second bond material having a second thickness less than the first thickness,
   wherein at least one of the plurality of die support structures includes a discrete circuit element directly electrically connected by at least two electrical terminals to the first package element but not directly electrically connected to the second package element.

2. The semiconductor device assembly of claim 1, wherein the plurality of die support structures includes die support structures disposed about a periphery of the semiconductor device assembly.

3. The semiconductor device assembly of claim 1, wherein the plurality of die support structures includes die support structures disposed in a medial region of the semiconductor device assembly.

4. The semiconductor device assembly of claim 1, wherein the first package element comprises a logic die, and wherein the second package element comprises a memory die.

5. The semiconductor device assembly of claim 1, wherein the first package element comprises a support substrate, and wherein the second package element comprises a logic die.

6. The semiconductor device assembly of claim 1, wherein the at least one of the plurality of die support structures has a first width less than a second width of the at least one of the first plurality of conductive features to which it is surface-mounted.

7. The semiconductor device assembly of claim 1, wherein the second thickness is measured between a lower surface of the die support structure and an upper surface of the corresponding at least one of the plurality of first conductive features.

8. The semiconductor device assembly of claim 1, wherein the second bond material includes a region disposed over the at least one of the plurality of first conductive features and laterally adjacent to the corresponding die support structure with a third thickness greater than the second thickness.

9. The semiconductor device assembly of claim 1, wherein the first conductive element of each of the plurality of interconnects has a first height greater than a second height of each of the plurality of die support structures.

10. A semiconductor device assembly, comprising:
    a first package element including a first plurality of conductive pads;
    a second package element disposed over the first package element, the second package element including a second plurality of conductive pads;
    a plurality of interconnects between the first and second package elements, wherein each of the plurality of interconnects includes a conductive element on one of the first plurality of conductive pads and a first bond material having a first thickness between the conductive element and a corresponding one of the second plurality of conductive pads; and
    a plurality of die support structures between the first and second package elements, wherein each of the plurality of die support structures has an upper surface in direct contact with the second package element and is surface-mounted to at least one of the second plurality of conductive pads by a second bond material having a second thickness less than the first thickness,
    wherein at least one of the plurality of die support structures includes a discrete circuit element directly electrically connected by at least two electrical terminals to the first package element but not directly electrically connected to the second package element.

11. The semiconductor device assembly of claim 10, wherein the plurality of die support structures includes die support structures disposed about a periphery of the semiconductor device assembly.

12. The semiconductor device assembly of claim 10, wherein the plurality of die support structures includes die support structures disposed in a medial region of the semiconductor device assembly.

13. The semiconductor device assembly of claim 10, wherein the first package element comprises a logic die, and wherein the second package element comprises a memory die.

14. The semiconductor device assembly of claim 10, wherein the first package element comprises a support substrate, and wherein the second package element comprises a logic die.

15. The semiconductor device assembly of claim 10, wherein the at least one of the plurality of die support structures has a first width less than a second width of the at least one of the second plurality of conductive pads to which it is surface-mounted.

16. The semiconductor device assembly of claim 10, wherein the second thickness is measured between a lower surface of the die support structure and an upper surface of the corresponding at least one of the second plurality of conductive pads.

17. The semiconductor device assembly of claim 10, wherein the second bond material includes a region disposed over the at least one of the plurality of second conductive pads and laterally adjacent to the corresponding die support structure with a third thickness greater than the second thickness.

18. The semiconductor device assembly of claim 10, wherein the conductive element of each of the plurality of interconnects has a first height greater than a second height of each of the plurality of die support structures.

19. The semiconductor device assembly of claim 10, wherein the discrete circuit element is one of a capacitor, a resistor, an inductor, or a transistor.

20. A semiconductor device assembly, comprising:
 a first package element including a first plurality of conductive pads;
 a second package element disposed over the first package element, the second package element including a second plurality of conductive pads;
 a plurality of interconnects between the first and second package elements, wherein each of the plurality of interconnects includes a conductive element on one of the first plurality of conductive pads and a first bond material having a first thickness between the conductive element and a corresponding one of the second plurality of conductive pads; and
 a die support structure between the first and second package elements, wherein the die support structure has an upper surface in direct contact with the second package element and is surface-mounted to at least one of the second plurality of conductive pads by a second bond material having a second thickness less than the first thickness,
 wherein the die support structure includes a discrete circuit element directly electrically connected by at least two electrical terminals to the first package element but not directly electrically connected to the second package element.

* * * * *